United States Patent
Kim et al.

(10) Patent No.: US 7,852,698 B2
(45) Date of Patent: Dec. 14, 2010

(54) VOLTAGE SUPPLY DEVICE AND NONVOLATILE MEMORY DEVICE HAVING THE SAME

(75) Inventors: Min-Su Kim, Yongin-Si (KR);
Byoung-Ho Kim, Suwon-si (KR);
Sung-Woo Park, Gunpo-si (KR);
Weon-Ho Park, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 227 days.

(21) Appl. No.: 12/287,184

(22) Filed: Oct. 7, 2008

(65) Prior Publication Data

US 2009/0121691 A1    May 14, 2009

(30) Foreign Application Priority Data

Nov. 8, 2007    (KR) .................. 10-2007-0113802

(51) Int. Cl.
*G11C 7/00*    (2006.01)
(52) U.S. Cl. ............. 365/226; 365/230.06; 365/230.01; 365/189.09
(58) Field of Classification Search .......... 365/226, 365/230.06, 230.01, 189.09
See application file for complete search history.

(56) References Cited

U.S. PATENT DOCUMENTS

| | | | |
|---|---|---|---|
| 6,438,032 B1 * | 8/2002 | Pekny et al. | 365/185.18 |
| 6,762,970 B2 * | 7/2004 | Joo | 365/230.06 |
| 7,508,252 B2 * | 3/2009 | Yamazaki et al. | 327/536 |

FOREIGN PATENT DOCUMENTS

| JP | 09069766 | 3/1997 |
|---|---|---|
| JP | 2000339046 | 12/2000 |
| KR | 1020050049104 A | 5/2005 |

* cited by examiner

*Primary Examiner*—Connie C Yoha
(74) *Attorney, Agent, or Firm*—Mills & Onello, LLP (57) ABSTRACT

A voltage supply device comprises: a charge pump configured to boost a power voltage and to supply the boosted power voltage to a output line; and a voltage control circuit configured to maintain a voltage level of the output line at a target voltage level; wherein the voltage control circuit comprises a reach-through element including a first region and a second region provided in a well, the reach-through element configured to control the voltage level of the output line, using a reach-through function between the first region and the second region.

15 Claims, 8 Drawing Sheets

VOLTAGE SUPPLY DEVICE AND NONVOLATILE MEMORY DEVICE HAVING THE SAME

PRIORITY STATEMENT

This application claims priority under 35 U.S.C §119 to Korean Patent Application No. 10-2007-0113802, filed on Nov. 8, 2007, in the Korean Intellectual Property Office, the entire contents of which are incorporated by reference in their entirety.

BACKGROUND

1. Technical Field

Embodiments of the present invention are related to semiconductor devices, and more particularly to voltage supply devices capable of maintaining an output voltage at a predetermined level.

2. Description of Related Art

Semiconductor devices commonly operate based on a power voltage Vcc that is provided from an external source. The voltage provided from an external source to the semiconductor devices has a regular voltage level. However, in order for the semiconductor devices to operate normally, various voltage levels are required. For example, in a NAND flash memory device, a read voltage, an erase voltage, a write voltage and a pass voltage all have different voltage levels. A voltage supply device is therefore employed to receive the regular voltage and to generate multi-level voltages. The voltage supply device commonly receives a voltage from an external source, and internally generates voltages that are required by the semiconductor devices for normal operation.

SUMMARY

Exemplary embodiments of the present invention are related to voltage supply device and non-volatile device including the same.

In one aspect, a voltage supply device comprises: a charge pump configured to boost a power voltage and to supply the boosted power voltage to a output line; and a voltage control circuit configured to maintain a voltage level of the output line at a target voltage level; wherein the voltage control circuit comprises a reach-through element including a first region and a second region provided in a well, the reach-through element configured to control the voltage level of the output line, using a reach-through function between the first region and the second region.

In one embodiment, the first region is connected to the output line, and the second region is connected to a ground terminal.

In another embodiment, the voltage control circuit is configured to electrically connect the first region and the second region when the voltage level of the output line reaches the target voltage level.

In another embodiment, the target voltage level is determined by a distance between the first region and the second region.

In another embodiment, the first region and second region are doped using the same type of impurity.

In another embodiment, the reach-through element is a bipolar transistor.

In another embodiment, the well is in a floating state.

In another aspect, a non-volatile memory device comprises: a memory cell array including a plurality of memory cells connected to a plurality of word lines; a row decoder configured to select the word lines; and a voltage supply device configured to supply a high voltage to the word lines selected by the row decoder, wherein the voltage supply device includes a charge pump configured to boost a power voltage and to supply the boosted power voltage to an output line, and a voltage control circuit configured to maintain a voltage level of the output line at a target voltage level, and wherein the voltage control circuit comprises a reach-through element including a first region and a second region provided in a well, the reach-through element configured to control the voltage level of the output line, by using a reach-through function between the first region and the second region.

In one embodiment, the first region is connected to the output line, and the second region is connected to a ground terminal.

In another embodiment, the voltage control circuit is configured to electrically connect the first region and the second region when the voltage level of the output line reaches the target voltage level.

In another embodiment, the target voltage level is determined by a distance between the first region and the second region.

In another embodiment, the first region and second region are doped using the same type of impurity.

In another embodiment, the reach-through element is a bipolar transistor.

In another embodiment, the well is in a floating state.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF EMBODIMENTS

The present invention will now be described more fully hereinafter with reference to the accompanying drawings, in which embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout.

It will be understood that when an element or layer is referred to as being "on", "connected to" or "coupled to" another element or layer, it can be directly on, connected or coupled to the other element, or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "bottom", "lower", "above", "top", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

The terminology used herein is for the purpose of describing particular embodiments only, and is not intended to be limiting of the present invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which this invention belongs. Accordingly, these terms can include equivalent terms that are created after such time. It will be further understood that terms, such as those defined in commonly used dictionaries, should be interpreted as having a meaning that is consistent with their meaning in the present specification and in the context of the relevant art, and will not be interpreted in an idealized or overly formal sense unless expressly so defined herein.

A voltage control circuit of a voltage supply device according to an embodiment of the present invention includes a reach-through element, which provides a reach-through function when a predetermined voltage level is supplied thereto. A reach-through element controls a voltage level of an output line as a target voltage level. When the voltage level of the output line reaches the target voltage level, reach-through is generated at the reach-through element. When the reach-through is generated at the reach-through element, the output line of the voltage control circuit is electrically connected to a ground terminal. Accordingly, the voltage level of the output line of the voltage supply device is maintained at the target voltage level.

Exemplary embodiments of the present invention will now be described with reference to drawings.

Figure 1:
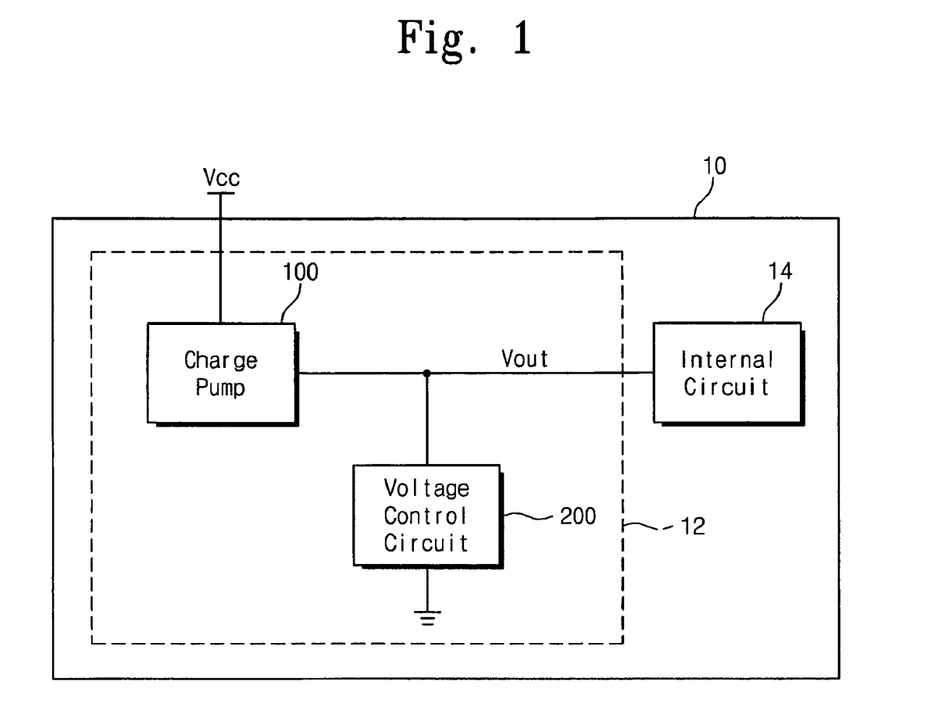
FIG. 1 is a block diagram of a semiconductor device.

FIG. 1 is a block diagram of a semiconductor device.

Referring to FIG. 1, a semiconductor device 10 includes a voltage supply device 12 and an internal circuit 14. The voltage supply device 12 boosts a voltage supplied from an external source, and controls the boosted voltage to a voltage level required in the internal circuit 14 of the semiconductor device 10. The voltage supply device 12 includes a charge pump 100 and a voltage control circuit 200. The charge pump 100 receives a power voltage Vcc. The charge pump 100 boosts the power voltage Vcc, and supplies the boosted voltage to an output line Vout. The voltage control circuit 200 is connected between the output line Vout and a ground terminal. The voltage control circuit 200 controls a voltage provided from the charge pump 100 so that it is maintained at a target voltage level required by the internal circuit 12 of the semiconductor device 10.

Figure 2:
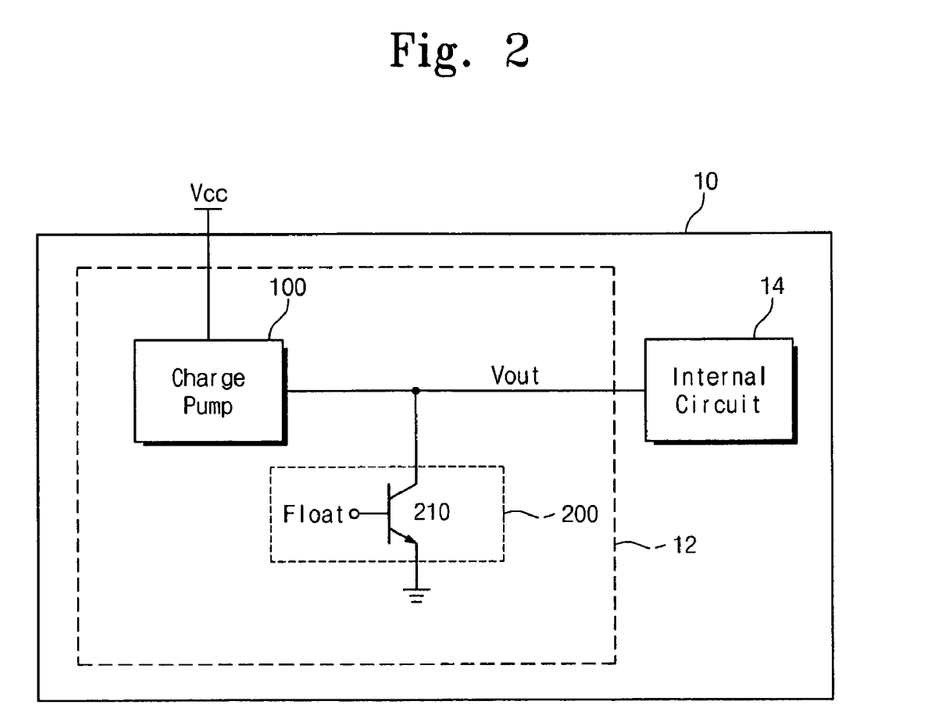
FIG. 2 is a block diagram of a semiconductor device in which a voltage control circuit in accordance with an embodiment of the present invention is applied.

FIG. 2 is a block diagram of a semiconductor device including a voltage control circuit in accordance with an embodiment of the present invention. The components and reference numbers are identical to those of FIG. 1.

Referring to FIG. 2, the voltage control circuit 200 of the present invention can comprise a bipolar transistor. A collector of the bipolar transistor is connected to the output line Vout, and an emitter thereof is connected to a ground terminal. A base of the bipolar transistor is in a floating state. The voltage control circuit 200 according to the embodiment of the present invention shown in FIG. 2 includes a bipolar transistor as a reach-through element. However, it is obvious to one skilled in the art that the reach-through element 210 is not limited to the bipolar transistor, and it may include one or more devices of various other devices. As a reach-through element 210, all possible elements may be used that have such a structure and an operational characteristic that the output line Vout and a ground terminal are electrically connected through a reach-through characteristic when the voltage level of the output line Vout reaches the target voltage level. The structure and operational characteristic of the reach-through element 210 will be described more specifically with reference to FIG. 3 and FIG. 4.

Figure 3:
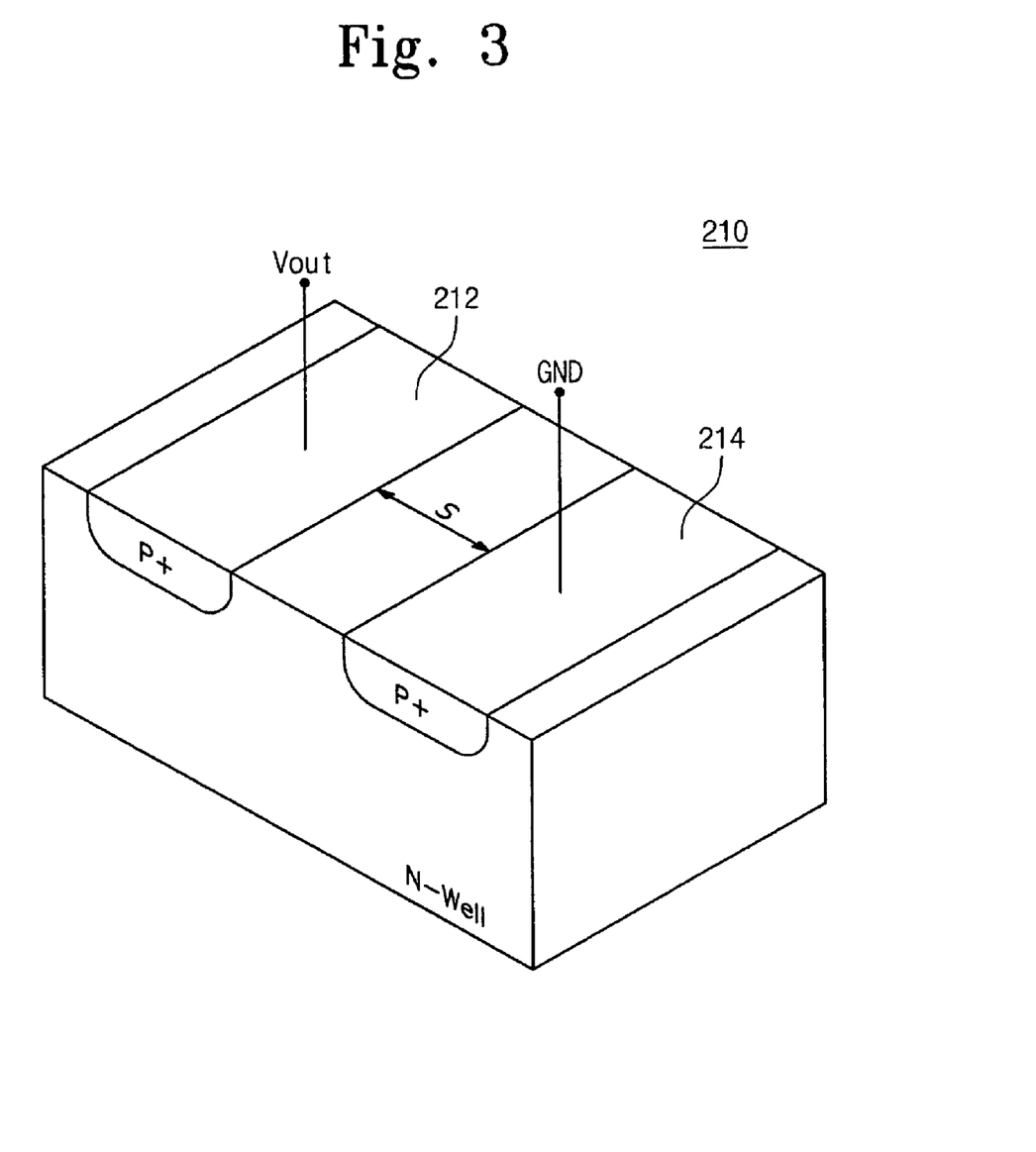
FIG. 3 illustrates a reach-through element according to an embodiment of the present invention.

FIG. 3 illustrates a reach-through element 210 according to an embodiment of the present invention.

Referring to FIG. 3, the reach-through element 210 according to the present invention includes an N-well doped using N-type impurities, a first region 212, and a second region 214. The first and second regions 212 and 214 are doped in P-type. In other embodiments, it will be obvious that a well may also be doped using P-type impurities and the first and second regions 212 and 214 may be doped using N-type impurities.

The first region 212 is connected to an output line Vout, and the second region 214 is connected to a ground terminal GND. The first region 212 and the second region 214 are spaced apart by a predetermined distance S. When fabricating the reach-through element 210, the distance S is determined so that a reach-through may be realized between the first and the second regions 212 and 214 when the voltage level of the output line Vout reaches the target voltage level.

When the voltage of the output line Vout is increased, a depletion region between the first region 212 and the N-well extends. When the voltage level of the output line Vout reaches the target voltage level, a reach-through is generated at the reach-through element 210. In other words, when the voltage level of the output line Vout reaches the target voltage level, the depletion region is extended so as to be connected between the first region 212 and the second region 214. Accordingly, when the voltage level of the output line Vout is at the target voltage level, a current flows between the first region 212 and the second region 214. In other words, when a reach-through occurs between the first and second regions 212 and 214, the output line Vout and the ground terminal GND become electrically connected.

Figure 4:
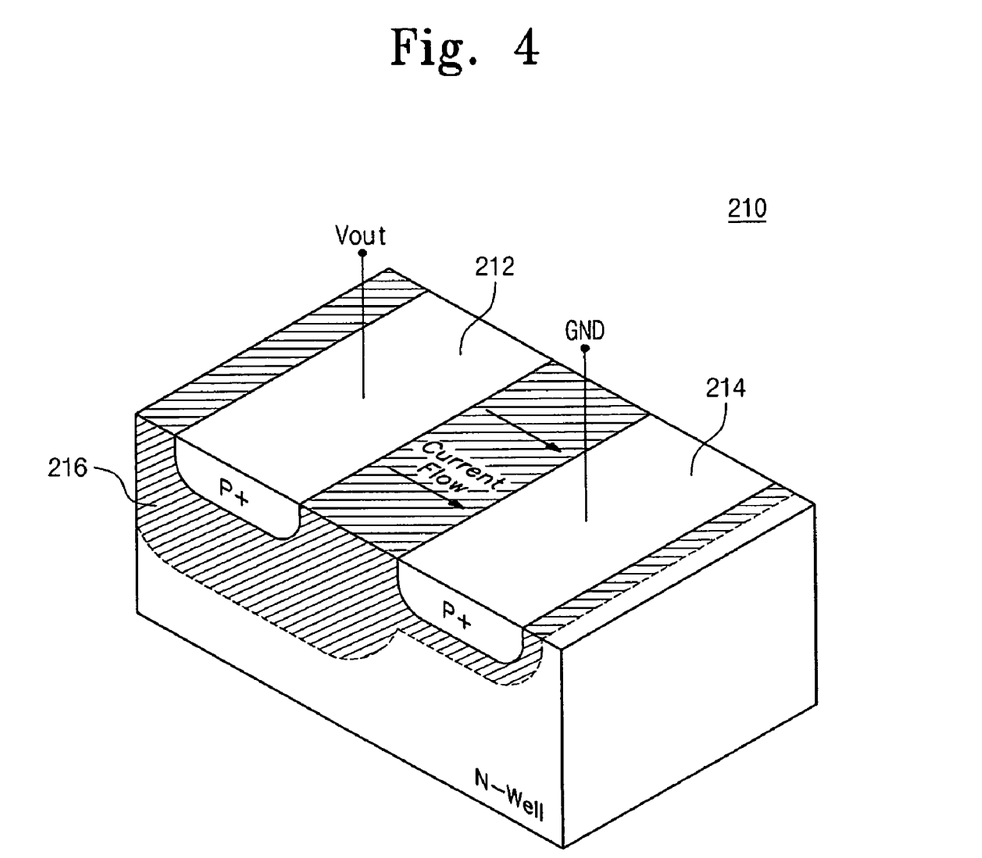
FIG. 4 illustrates a state in which a reach-through has occurred at the reach-through element of FIG. 3.

FIG. 4 illustrates a state in which a reach-through has occurred at the reach-through element 210 of FIG. 3. The components and reference numbers are identical to those of FIG. 3.

Referring to FIG. 4, a depletion region 216 is formed between the first region 212 and second region 214. A major carrier of the first and second regions 212 and 214 are holes. The depletion region 216 is a region which includes a greater number of holes than the number of electrons. In other words, the output line Vout and a ground terminal GND are electrically connected via a path formed by the holes. Accordingly, current flows between the first region 212 and the second region 214, and the voltage of the output line Vout may be maintained at the target voltage level.

A voltage level for generating a reach-through at the reach-through element 210 is determined by the distance S (see FIG. 3) between the first region 210 and the second region 214. When the distance S between the first and second regions 212 and 214 becomes longer, the voltage level of the first region 212 required to connect the first and second regions 212 and 214 via the depletion region 216 increases. On the other hand, when the distance S between the first and second regions 212 and 214 becomes shorter, the voltage level of the first region 212 required to connect the first and second regions 212 and 214 via the depletion region 216 decreases. Accordingly, when fabricating the reach-through element 210, the target voltage level may be controlled by adjusting the distance S between the first and second regions 212 and 214.

When the target voltage level is supplied at the first region 212 of the reach-through element 210, reach-through occurs at the reach-through element 210 so that the first and second regions 212 and 214 of the reach-through element 210 are electrically connected. In other words, a bipolar transistor may be used for the reach-through element 210 according to the present invention. An emitter and a collector of the bipolar transistor each correspond to the first and second regions 212 and 214 of the reach-through elements of FIG. 3 and FIG. 4. A base of the bipolar transistor corresponds to the N-well of the reach-through element 210 of FIG. 3 and FIG. 4. When a voltage is supplied to the emitter and collector of the bipolar transistor, a depletion region is formed in the base of the bipolar transistor. When the difference in voltages between the emitter and collector reaches the target voltage level, the emitter and collector are electrically connected through the depletion region. Here, the target voltage level may be controlled by adjusting the thickness of the base.

The structure and characteristic of the reach-through element 210 according to the embodiments of present invention correspond to a bipolar transistor. For a clear description of embodiments of the present invention, a bipolar transistor is used in the diagrams to depict the reach-through element 210 of the embodiments of the present invention. However, it will be obvious that the reach-through element 210 according to the embodiments of present invention is not limited to the bipolar transistor.

In brief, in a case where a voltage is not supplied to the output line Vout, the output line Vout and ground terminal GND become electrically isolated. When a voltage is supplied to the output line Vout, the depletion region 216 is formed between the first region 212 and the N-well. When the voltage level of the output line Vout reaches the target voltage level, reach-through is generated at the reach-through element 210. In other words, the first and second regions 212 and 214 are connected through the depletion region 216. The voltage of the output line Vout does not increase any further as the output line Vout and the ground terminal GND are electrically connected. Here, the target voltage level is determined according to the distance between the first region 212 and the second region 214. Therefore, when fabricating the reach-through element 210, the target voltage level may be controlled by adjusting the distance S between the first and second regions 212 and 214.

Figure 5:
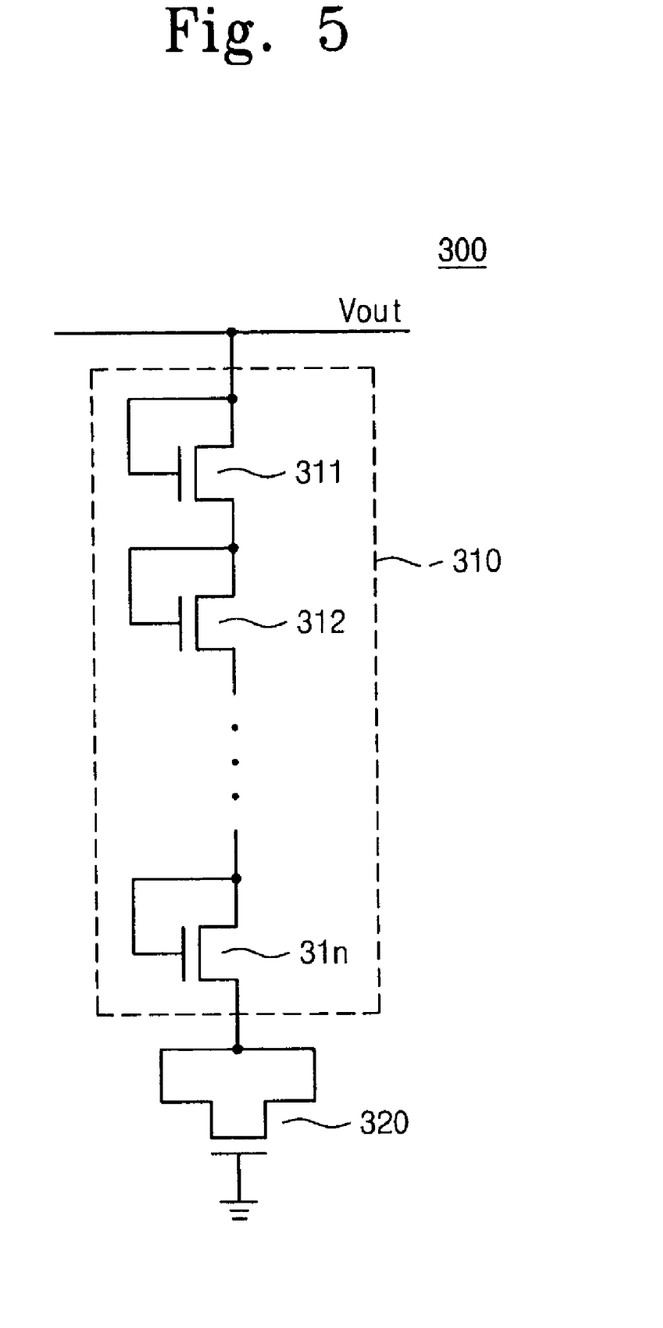
FIG. 5 is a block diagram of another exemplary embodiment of the voltage control circuit of FIG. 1.

FIG. 5 is a block diagram of another exemplary embodiment of the voltage control circuit of FIG. 1.

Referring to FIG. 5, a voltage control circuit 300 includes an output line Vout, a voltage sustain part 310 and an NMOS transistor 320. The voltage sustain part 310 includes a plurality of diodes 311 to 31$n$ connected in series between the output line Vout and the NMOS transistor 320. A source and a drain of the NMOS transistor 320 are commonly connected to the voltage sustain part 310, and a gate thereof is connected to the ground terminal.

When the voltage of the output line Vout becomes higher than a sum of threshold voltages of the plurality of diodes 311 to 31$n$, a voltage is supplied to the source/drain of the NMOS transistor 320. The source/drain of the NMOS transistor 320 is supplied a voltage which decreases by a voltage of a voltage level of the output line Vout minus the sum of the threshold voltages of the diodes 311 to 31$n$. The source and drain of the NMOS transistor 320 are commonly connected to the voltage sustain part 310, and the gate thereof is connected to the ground terminal. When the voltage supplied to the source/drain of the NMOS transistor 320 becomes higher than the predetermined voltage level, tunneling occurs between the source/drain of the NMOS transistor 320 and the ground terminal. In other words, charge accumulated at the source/drain of the NMOS transistor 320 flows to the ground terminal through a gate insulation layer and a gate of the NMOS transistor 320. Accordingly, the voltage level of the output line Vout is maintained at the sum of the voltage level for generating the tunneling at the NMOS transistor 320 and the collective threshold voltages of the diodes 311 to 31n.

Figure 6:
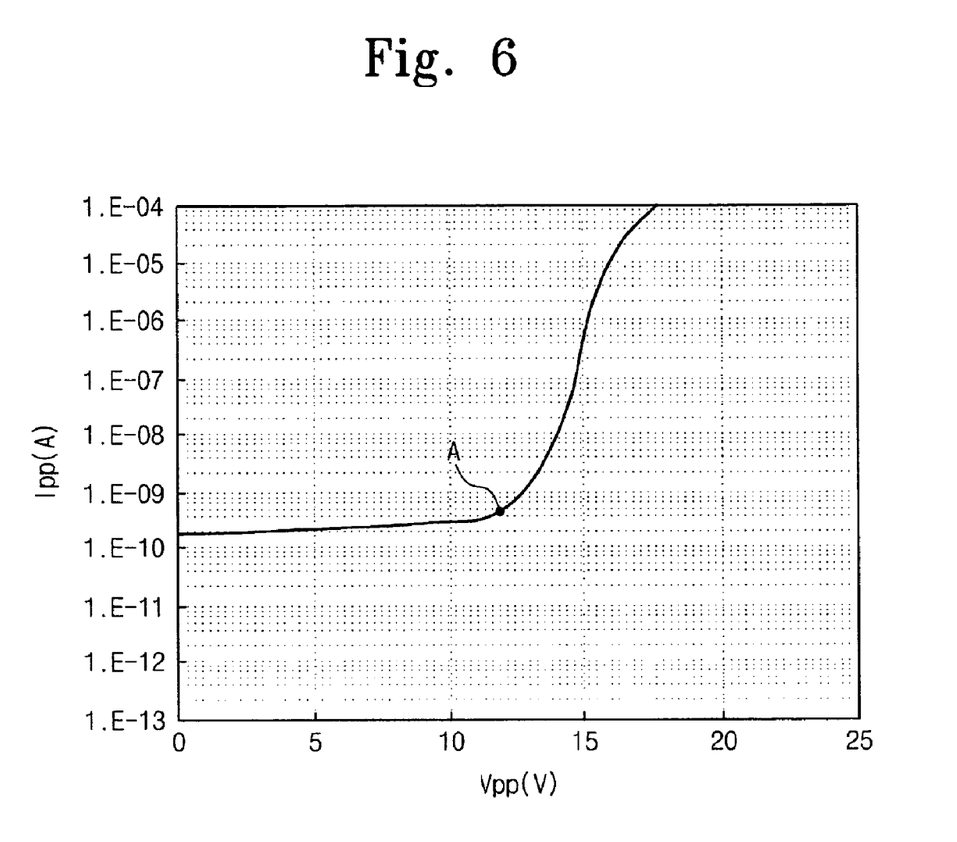
FIG. 6 illustrates an operational characteristic of the voltage control circuit of FIG. 5.

FIG. 6 illustrates an operational characteristic of the voltage control circuit of FIG. 5.

Referring to FIG. 6, the x axis is a voltage level Vpp provided by the charge pump 100 (see FIG. 1), and the y axis shows the amount of current Ipp flowing through the voltage control circuit 300 (see FIG. 5). FIG. 6 illustrates a test result of the voltage control circuit 300 formed using TEG (test element group). When the voltage level of the output line Vout reaches the level A, the current flowing through the voltage control circuit 300 increases significantly. In other words, when the voltage level of the output line Vout reaches the level A, tunneling occurs at the NMOS transistor 320 (see FIG. 5).

Figure 7:
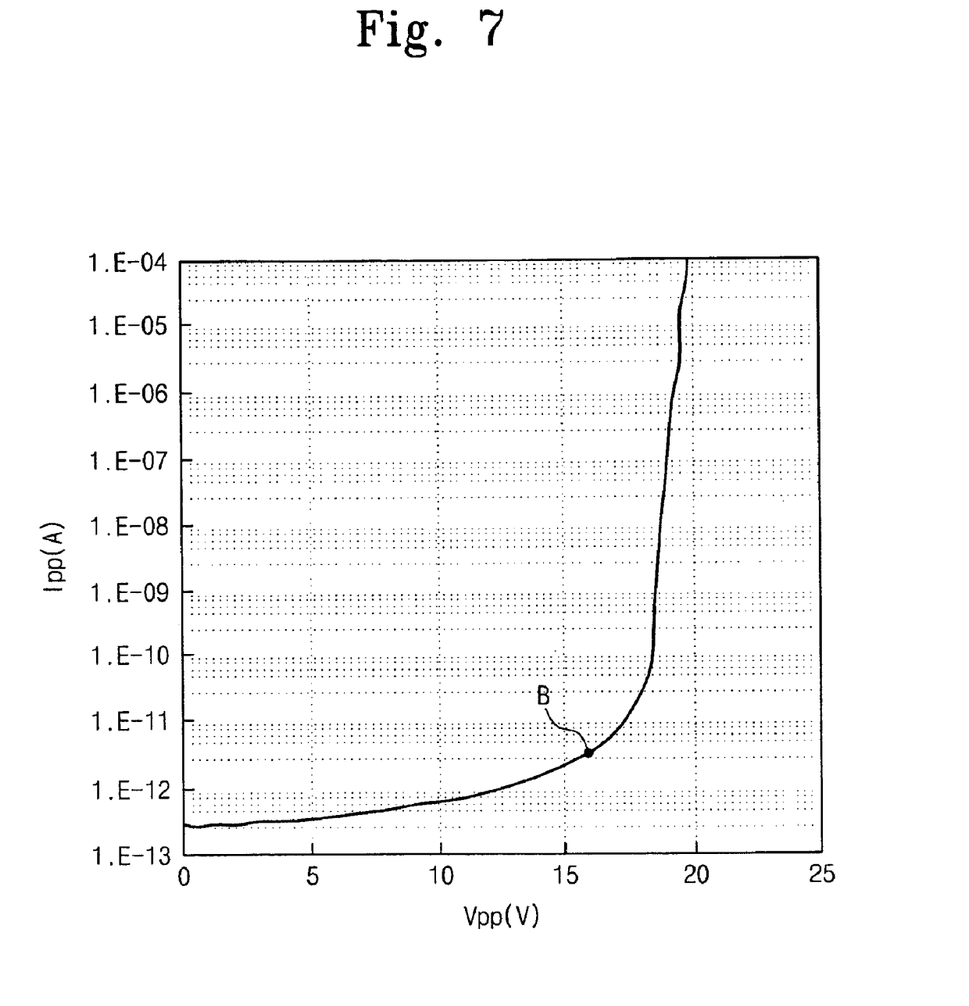
FIG. 7 illustrates an operational characteristic of the reach-through element of FIG. 2.

FIG. 7 illustrates an operational characteristic of the reach-through element 210 of FIG. 3.

Referring to FIG. 7, the x axis is the voltage level Vpp provided by the charge pump 100 (see FIG. 2), and the y axis shows the amount of current Ipp flowing through the reach-through element 210. FIG. 7 illustrates a test result of the reach-through element 210 formed using TEG (test element group). When the voltage level of the output line Vout reaches the level B, the amount of current flowing through reach-through element 210 increases significantly. In other words, when the voltage level of the output line Vout reaches the level B, reach-through occurs, so that the first region 212 and the second region 214 are electrically connected via the depletion region 216 (see FIG. 4) of the reach-through element 210.

Referring to FIGS. 3, 5, 6, and 7, when the voltage of the output line Vout reaches the levels A and B, an increased amount of current flowing through the reach-through element 210 is larger than an increased amount of current flowing through the voltage control circuit 300. The voltage control circuit 200 is configured so that a predetermined voltage difference is generated between the output line Vout and the ground terminal GND. The voltage control circuit 300 maintains the voltage difference between the output line Vout and the ground terminal GND, by using the diodes 311 to 31n and the NMOS transistor 320. The reach-through element 210 maintains the voltage difference between the output line Vout and the ground terminal GND, by using the distance S between the first region 212 and the second region 214. When the voltage level of the output line Vout becomes higher than the required, or desired, voltage level, the voltage control circuit 200 drains current from the output line Vout to lower the voltage level of the output line Vout. In other words, when the voltage level of the output line Vout becomes higher than the required voltage level, if the amount of current drained from the output line Vout increases in large amplitude, the voltage level of the output line Vout may be maintained more stably. Accordingly, if the amount of current drained from the output line Vout increases in large amplitude, distribution of the voltage level of the output line Vout is reduced.

Figure 8:
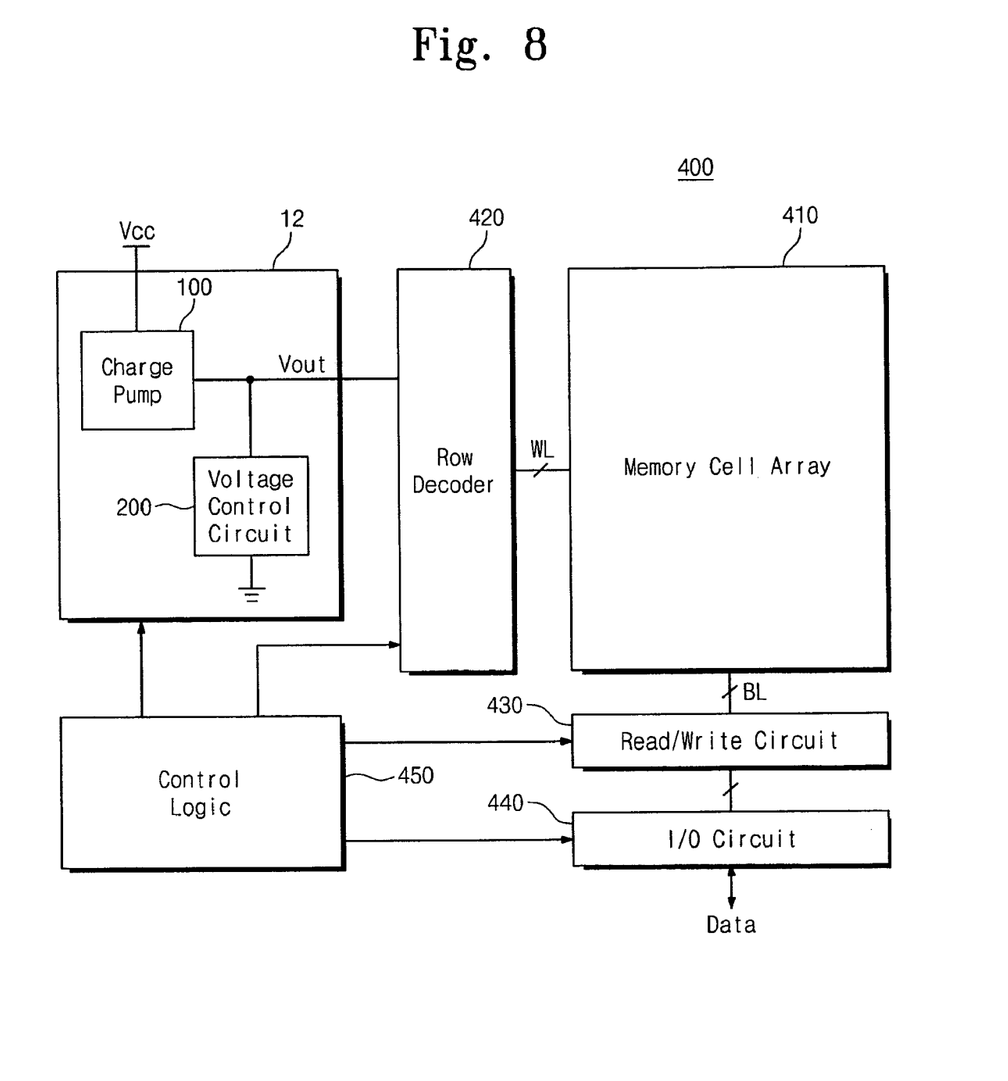
FIG. 8 is a block diagram illustrating a non-volatile memory device including the voltage supply device in accordance with an embodiment of the present invention.

FIG. 8 is a block diagram illustrating a non-volatile memory device including the voltage supply device 12 (see FIG. 1) in accordance with an embodiment of the present invention.

Referring to FIG. 8, the non-volatile memory device 400 includes a memory cell array 410, a row decoder 420, a read/write circuit 430, an input/output circuit 440, a control logic circuit 450, and a voltage supply device 12.

The memory cell array 410 is connected to the row decoder 420 and the read/write circuit 430. The memory cell array 410 includes a plurality of word lines WL connected to the row decoder 420. The memory cell array 410 is connected to the read/write circuit 430, and includes a plurality of bit lines BL which intersect the word lines WL. Memory cells are formed at intersections of the word lines WL and the bit lines BL, respectively.

The row decoder 420 is connected to the memory cell array 410, the control logic 450, and the voltage supply device 12. The row decoder 420 selects the word lines WL in response to the control logic 450. A high voltage required to program the memory cells of the memory cell array 420 is supplied from the voltage supply device 12.

The read/write circuit 430 is connected to the memory cell array 410, the input/output circuit 440 and the control logic 450. The read/write circuit 430 writes data at the memory cell array 410 through the bit lines BL, in response to the control logic 450. The read/write circuit 430 reads data from the cell array 410 through the bit lines BL, in response to the control logic 450. The read/write circuit 430 exchanges data with the input/output circuit 440.

The input/output circuit 440 is connected to the read/write circuit 430 and the control logic 450. The input/output circuit 440 exchanges data with the outside in response to the control logic 450. The input/output circuit 440 outputs the data transferred from the read/write circuit 430 to the outside in response to the control logic 450. The input/output circuit 440 transfers data from an external source to the read/write circuit 430 in response to the control logic 450.

The control logic 450 is connected to the row decoder 420, the read/write circuit 430, the input/output circuit 440 and the voltage supply device 12. The control logic 450 is configured to control the row decoder 420, the read/write circuit 430, the input/output circuit 440 and the voltage supply device 12 to perform program, erase and read operations. When a high voltage is required for the program, erase or read operation, the control logic 450 controls the voltage supply device 12 to provide the high voltage to the row decoder 420.

The voltage supply device 12 is connected to the row decoder 420 and the control logic 450. The voltage supply device 12 provides the required voltage to the row decoder 420 in response to the control logic 450. The voltage supply device 12 includes a charge pump 100 and a voltage control circuit 200. The charge pump 100 receives a power voltage Vcc and boosts the power voltage Vcc. The boosted voltage is provided to the output line Vout. The voltage control circuit 200 controls the voltage level of the output line Vout to the required voltage level. The voltage supply device 12 supplies a voltage to the non-volatile memory device 400 through the output line Vout.

The voltage control circuit 200 of the voltage supply device 10 in accordance with embodiments of the present invention is formed with a single reach-through element 210. Accordingly, when a plurality of elements (e.g. diodes or resistors) are used, the voltage level of the output line Vout may be prevented from being dispersed, as a result of dispersion in threshold voltages of the diodes or dispersion in resistance values of the resistors. When the voltage level of the output line Vout reaches the target voltage level, a reach-through function occurs at the reach-through element 210. In other words, the output line Vout and ground terminal GND are electrically connected by means of the reach-through. Thus, the voltage level of the output line Vout may be sustained at the target voltage level.

According to the above-described exemplary embodiments, the target voltage level may be controlled by adjusting the distance S between the first region 212 and the second region 214. However, in other embodiments, the target voltage level may alternatively or additionally be controlled by adjusting the doping density of the first region 212, second region 214 and/or the N-well.

The voltage control circuit of the voltage supply device in accordance with embodiments of the present invention is formed with a single reach-through element. Therefore, when using a plurality of elements, a voltage level of an output line may be prevented from being dispersed due to a distribution of threshold voltages of diodes or a distribution of resistance values of resistors. In addition, the voltage supply device of the embodiments of present invention may sustain a regular output voltage, even when the voltage level provided from an external source is varied. According, reliability of the voltage supply device may be improved.

Although the present invention has been described in connection with the embodiments of the present invention illustrated in the accompanying drawings, it is not limited thereto. Persons with skill in the art will recognize that embodiments of the present invention may be applied to other types of memory devices. The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A voltage supply device comprising:
a charge pump configured to boost a power voltage and to supply the boosted power voltage to an output line; and
a voltage control circuit configured to maintain a voltage level of the output line at a target voltage level, the voltage control circuit comprising a reach-through element including a first region and a second region provided in a well of a semiconductor substrate, the reach-through element configured to control the voltage level of the output line, using a reach-through function between the first region and the second region;
wherein the voltage control circuit is configured to electrically connect the first region and the second region when the voltage level of the output line reaches the target voltage level.

2. The voltage supply device of claim 1, wherein the first region is connected to the output line, and the second region is connected to a ground terminal.

3. The voltage supply device of claim 2, wherein the voltage control circuit is further configured to extend a depletion region between the first region and the second region when the voltage level of the output line reaches the target voltage level such that the first region and second region are electrically connected.

4. The voltage supply device of claim 1, wherein the target voltage level is determined by a distance between the first region and the second region.

5. The voltage supply device of claim 1, wherein the first region and second region are doped using the same type of impurity.

6. The voltage supply device of claim 1, wherein the reach-through element is a bipolar transistor.

7. The voltage supply device of claim 1, wherein the well is in a floating state.

8. A non-volatile memory device comprising:
a memory cell array including a plurality of memory cells connected to a plurality of word lines;
a row decoder configured to select the word lines; and
a voltage supply device configured to supply a high voltage to the word lines selected by the row decoder,
wherein the voltage supply device includes a charge pump configured to boost a power voltage and to supply the boosted power voltage to an output line, and a voltage control circuit configured to maintain a voltage level of the output line at a target voltage level, the voltage control circuit comprising a reach-through element including a first region and a second region provided in a well of a semiconductor substrate, the reach-through element configured to control the voltage level of the output line, by using a reach-through function between the first region and the second region, wherein the voltage control circuit is configured to electrically connect the first region and the second region when the voltage level of the output line reaches the target voltage level.

9. The non-volatile memory device of claim 8, wherein the first region is connected to the output line, and the second region is connected to a ground terminal.

10. The non-volatile memory device of claim 9, wherein the reach-though function configures the voltage control circuit to extend a depletion region between the first region and the second region when the voltage level of the output line reaches the target voltage level such that the first region and second region are electrically connected.

11. The non-volatile memory device of claim 8, wherein the target voltage level is determined by a distance between the first region and the second region.

12. The non-volatile memory device of claim 8, wherein the first region and second region are doped using the same type of impurity.

13. The non-volatile memory device of claim 8, wherein the reach-through element is a bipolar transistor.

14. The non-volatile memory device of claim 8, wherein the well is in a floating state.

15. The voltage supply device of claim 2, wherein the reach-though function configures the voltage control circuit to extend a depletion region between the first region and the second region when the voltage level of the output line reaches the target voltage level such that the first region and second region are electrically connected.

* * * * *